United States Patent
Parat et al.

(10) Patent No.: US 6,570,225 B2
(45) Date of Patent: May 27, 2003

(54) METHOD FOR IMPROVED ELECTROSTATIC DISCHARGE PROTECTION

(75) Inventors: Krishna K. Parat, Palo Alta, CA (US); Neal K. Clark, Cameron Park, CA (US); Timothy J. Maloney, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/021,543

(22) Filed: Oct. 22, 2001

(65) Prior Publication Data

US 2002/0079541 A1 Jun. 27, 2002

Related U.S. Application Data

(62) Division of application No. 09/351,815, filed on Jul. 12, 1999, now abandoned.

(51) Int. Cl.[7] .............................................. H01L 23/62
(52) U.S. Cl. ..................................... 257/355; 257/356
(58) Field of Search ................................. 257/355, 356, 257/357, 360; 361/58, 91

(56) References Cited

U.S. PATENT DOCUMENTS

| | | | |
|---|---|---|---|
| 5,465,189 A | | 11/1995 | Polgreen et al. |
| 5,530,612 A | | 6/1996 | Maloney |
| 5,670,814 A | * | 9/1997 | Wu et al. ................... 257/360 |
| 5,717,560 A | | 2/1998 | Doyle et al. |
| 5,719,737 A | | 2/1998 | Maloney |
| 5,903,032 A | * | 5/1999 | Duvvury .................... 257/356 |
| 5,932,916 A | * | 8/1999 | Jung ......................... 257/355 |
| 6,281,527 B1 | * | 8/2001 | Chen ......................... 257/168 |

* cited by examiner

*Primary Examiner*—Tuan H. Nguyen
(74) *Attorney, Agent, or Firm*—Blakely, Sokoloff, Taylor & Zafman LLP

(57) ABSTRACT

A method includes introducing into an integrated circuit a device comprising a transistor including a drain of a first conductivity type and a first concentration in a well of a first conductivity type and a second concentration, a first region of the first conductivity type and first concentration in the well, and a second region of a second conductivity type in the well between the first region and the drain. The method also includes coupling the device to a pad. In the presence of a pre-determined current at the pad, the device biases a junction between the second region and the well toward current flow in the absence of a latch-up event.

6 Claims, 5 Drawing Sheets

METHOD FOR IMPROVED ELECTROSTATIC DISCHARGE PROTECTION

This is a divisional of application Ser. No. 09/351,815, filed Jul. 12, 1999, now abandoned.

BACKGROUND OF THE INVENTION

I. Field of the Invention

The invention relates to electronic devices. More specifically, the invention relates to electrostatic discharge (ESD) protection devices.

II. Background of the Invention

An electrostatic discharge (ESD) device is a circuit element able to detect an electrostatic event such as a high voltage or high current event (spike). When the ESD device detects a high voltage or current event, it turns on and acts as a short circuit for the transient voltage peak to dissipate its current to a ground plane or to another plane. In normal operation, the ESD device does nothing (it's turned off). The ESD device is designed such that it will not turn on anywhere around the normal operation range of voltage such as 0 to 5 volts for a CMOS device.

Grounded gate NMOS devices operating in the snapback regime are commonly used as ESD protection devices. For these devices to be effective, special care is taken in their layout to spread out the ESD current uniformly across the width of the device. The common approach for doing this is to have the drain contacts of the grounded gate NMOS placed at large enough a space from the gate edge, such that the large resistance of the drain diffusion will prevent the current from crowding into any local regions near the high field gate/drain edge. This approach, however, generally does not work in the case of salicided process because of the very low resistance of the salicided drain.

One way to address this problem is to break the drain diffusion and introduce an N-Well between the drain contact region and the gate edge region. The higher resistance of the N-Well provides the necessary resistance to make the current flow path uniform to maintain a uniform current flow. However, the maximum current per unit of N-Well width that can flow through the N-Well is limited by the total number of carriers in the N-Well (approximately of the order of q*N*vsat where q is the electronic charge, N is the total sheet carrier concentration in the N-Well and vsat is the saturated velocity of electrons through the N-Well). As a result, for processes that have low N-Well concentration, this approach is not very effective, since the ESD current handling ability of the device is reduced due to the lower N-Well concentration. Often, in these cases, the device will fail at very low ESD stress voltages because of the inability of the N-Well to support the current. What is needed is a scheme that can provide high enough resistance in the current path to keep the current flow uniform, yet does not limit the current capability as severely as described above, so that the final ESD capability is dictated by the grounded gate transistor and not by the N-Well.

BRIEF SUMMARY OF THE INVENTION

A method and a device are disclosed. One embodiment of a method includes introducing into an integrated circuit a device comprising a transistor including a drain of a first conductivity type and a first concentration in a well of a first conductivity type and a second concentration, a first region of the first conductivity type and first concentration in the well, and a second region of a second conductivity type in the well between the first region and the drain. The method also includes coupling the device to a pad. In the presence of a pre-determined current at the pad, the device biases a junction between the second region and the well toward current flow in the absence of a latch-up event.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the invention.

Figure 1:
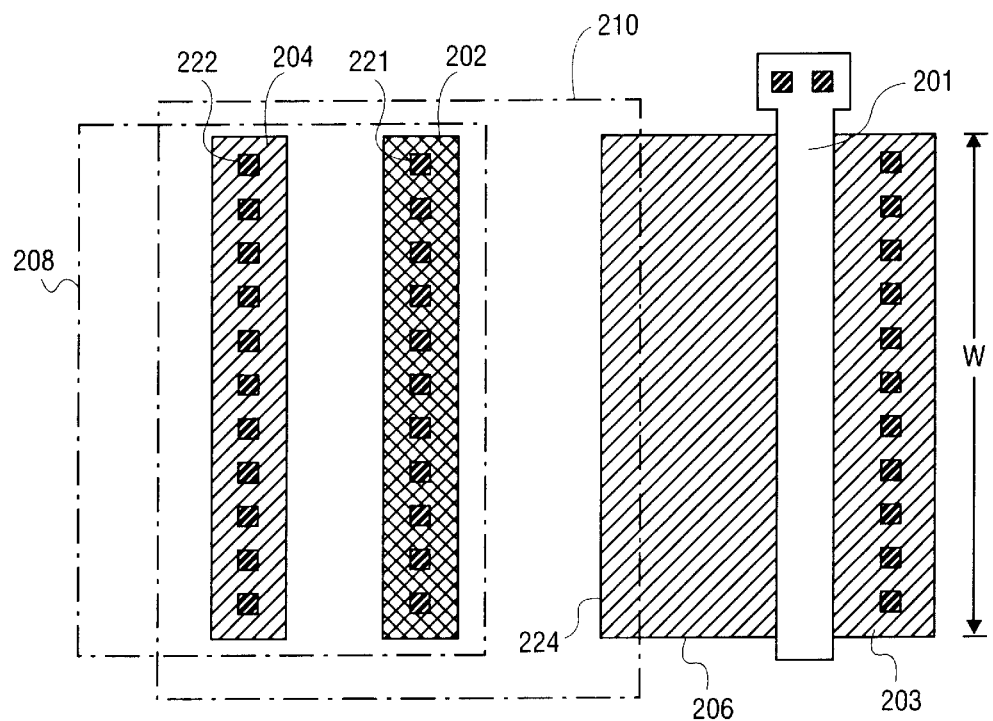
FIG. 1 shows a top plan view of an embodiment of an electrostatic discharge device according to the invention.
Figure 2:
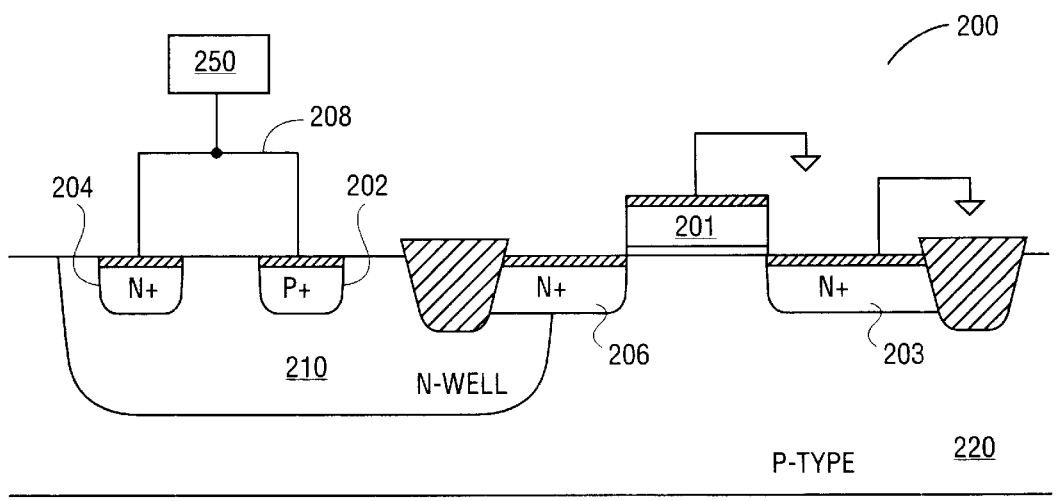
FIG. 2 shows a cross-sectional and schematic side view of the device of FIG. 1.

FIG. 1 illustrates a top plan view of one embodiment of an electrostatic discharge (ESD) device according to the invention. FIG. 2 is a cross-sectional and schematic side view of the device of FIG. 1. ESD device 200 includes an N-type metal oxide semiconductor (NMOS) field effect transistor (FET) including gate 201, source 203, and drain 206. In the embodiment described, gate 201 is made of polysilicon. Source 203 and drain 206 are N+-type conductivity regions. In this embodiment, gate 201 and source 203 are grounded.

ESD device 200 also includes first region 204 that includes N+ carriers (N+-type conductivity). First region 204 is detached from drain 206 itself. Furthermore, ESD device 200 includes N-Well 210 introduced between drain 206 and first region 204. First region 204 is coupled to pad 250 through a plurality of drain contacts 222 and metal 208. Pad 250 is, for example, a conventional integrated circuit pad for electrically coupling a chip to a package.

Second P+-type region 202 (P+-type conductivity) is introduced between the N+ region of drain edge 224 and first region 204. Second region 202 is coupled to first region 204 through contacts 221 and metal 208 to pad 250.

As best illustrated in FIG. 1, first region 204 and second region 202 are formed of a similar device width, w, as drain 206. In one embodiment, the doping characteristics of first region 204 are similar to drain 206. Accordingly, in one embodiment, details on the formation of first region 204 (e.g., doping concentration) follow conventional state-of-the-art processing and are therefore not described herein. Similarly, in this embodiment, second region 202 formation follows conventional state-of-the-art processing methods for forming a P+-type diffusion or junction region. In this example, each of gate 201, drain 206, first region 204, source 203, and second region 202 are salicided according to state-of-the-art techniques. Contacts 222 to pad 250 are positioned about the width of first region 204 and contacts 221 to pad 250 are positioned about the width of second region 202.

Figure 3:
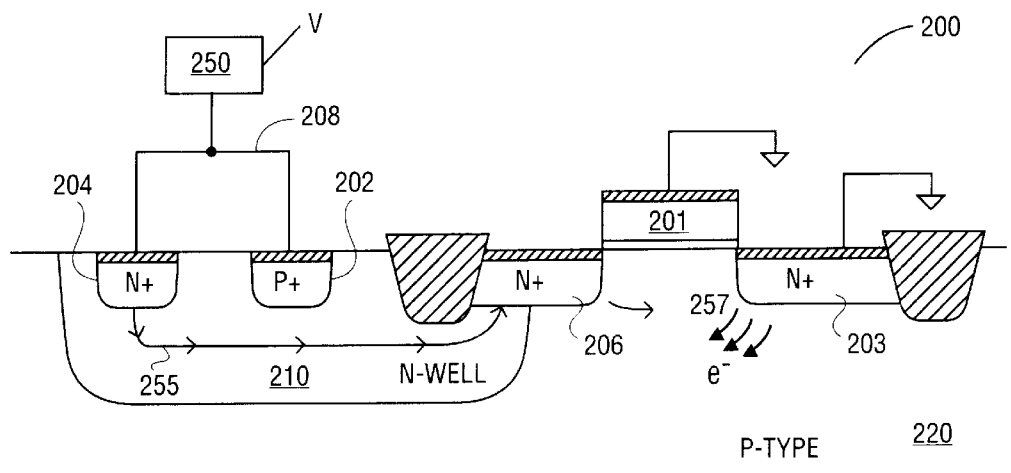
FIG. 3 shows a cross-sectional and schematic side view of the device of FIG. 2 and schematically illustrates breakdown current flow to the drain and snapback.
Figure 4:
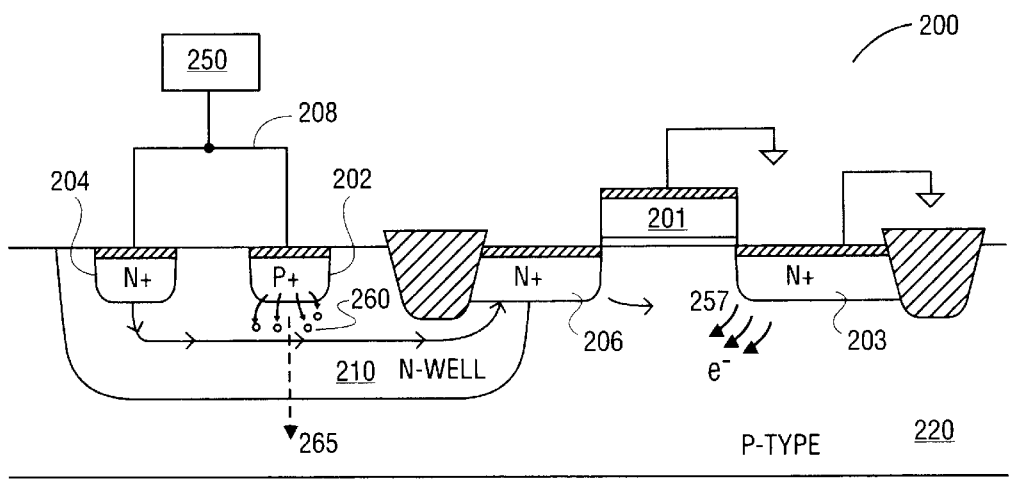
FIG. 4 shows the cross-sectional and schematic side view of FIG. 2 and schematically shows forward biasing at a P+-conductivity type region in an N-Well.
Figure 5:
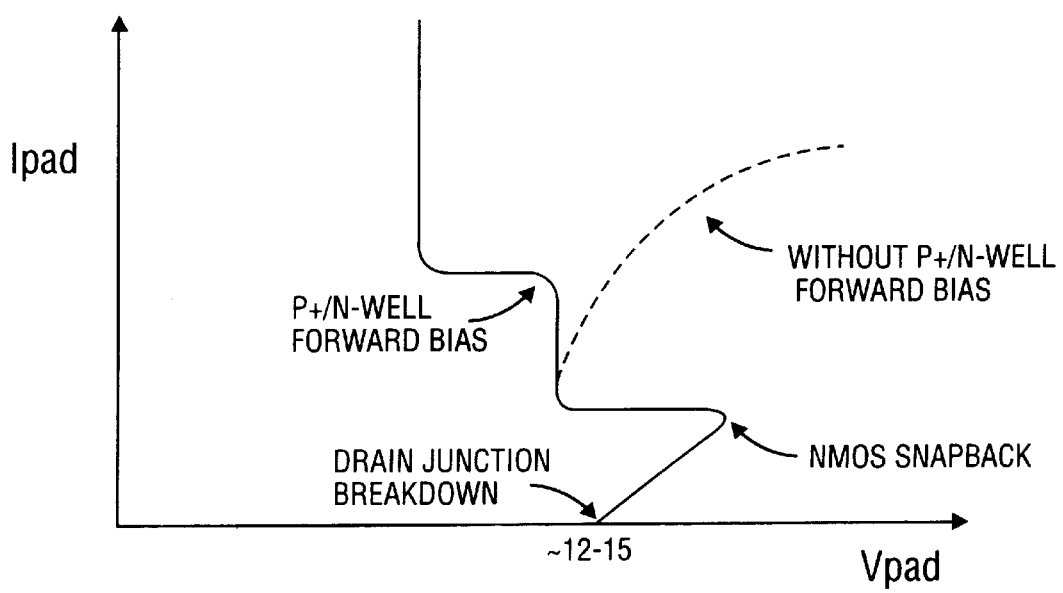
FIG. 5 shows a graphical representation of representative current conduction for the embodiment of the device shown in FIGS. 1–4.

FIG. 3 and FIG. 4 show the side view of FIG. 2 and illustrate the operation of this embodiment of an device of the invention at different voltage levels. FIG. 5 is a graphical representation of the operation of the embodiment of the device. As shown in FIG. 3, when a voltage is initially applied at pad 250, the voltage will build-up and be transmitted to drain 206. The drain edge will eventually go into breakdown and allow the flow of current 255 to source 203. The breakdown voltage is generally a function of the drain doping, the channel doping next to drain, and the gate oxide thickness. Once the drain junction breaks down, the current flow will continue to increase until the next event. The drain junction breakdown is illustrated in FIG. 5 at approximately 12–15 volts.

N-Well 210 typically has a higher resistance than first region 204 or drain 206. Typically, N-Well 210 will have a resistance on the order of 500–2,000 ohms per square ($\Omega/\square$) while the resistance of drain 206 and first region 204, if patterned together, will have a resistance on the order of 50 $\Omega/\square$. A typical salicide process reduces the resistance of the drain (and hence, the first region) from 50 $\Omega/\square$ to about 3 $\Omega/\square$. The greater resistance of N-Well 210 tends to maintain uniform breakdown current flow ("drift") across the entire width of the device. The uniform flow of current through N-Well 210 reduces potential "hot spots" where current could collect and potentially damage a semiconductor substrate.

In general, the concentration of N-Well 210 will be high enough to sustain the breakdown current flow without becoming a limitor. As more breakdown current flows from the drain into substrate 201, the substrate potential near the drain edge and near the source junction begins to build-up. If the substrate potential near the source/substrate junction builds to a sufficient level, then the source to substrate junction can become forward biased and, as shown in FIG. 3, source 203 injects electrons 257 into the substrate—a snapback condition. Once the NMOS goes into snapback, a large amount of current can flow between the drain and the source of the NMOS. The effect of the snapback is illustrated in FIG. 5. Under this condition, generally only the maximum current that can be supported by N-Well 210 limits the current flow.

Typically, conductivity doping of a well is less than conductivity doping of a transistor junction such as drain 206. A typical N-Well conductivity doping concentration is on the order of 5E16 to 3E17 carriers/cm$^2$ (sheet carrier resistance 5E12 to 3E13 carriers/cm$^2$) while the conductivity doping of a drain is on the order of 1E20 carriers/cm$^3$ (sheet carrier resistance of 5E15 carriers/cm$^2$). Accordingly, there are a finite number of electrons in N-Well 210 and, once N-Well 210 current reaches its saturation limit (q·n·vsat), then the inability to pass increasing current through the device will cause the pad voltage to rise. The saturation limit is indicated by the dashed line in FIG. 5 where the amount of current conducted approaches a constant for an increasing pad voltage.

In order to conduct additional current introduced at pad 250, the device of the invention includes second region 202 that is, in this example, of a P+-type conductivity doped to a concentration of, for example, 1E20 carriers/cm$^3$. As current flows through N-Well 210, a voltage drop will build-up between a portion of N-Well 210 under first region 204 and a portion of N-Well 210 under second region 202. Since second region 202 is at the pad voltage, the voltage drop will cause the second region 202 to N-Well 210 junction to become more forward biased as the current in N-Well 210 increases. As the pad voltage continues to increase because N-Well current is saturated, the forward bias will increase (since the P+ voltage rises with the pad voltage while the N-Well potential below second region 202 remains effectively constant). At a certain voltage, the junction becomes sufficiently forward biased to "turn on."

The forward-biased junction causes P+-type conductivity type second region 202 to inject holes 260 into N-Well 210. The additional holes in N-Well 210 can sustain additional electrons and thus contribute to additional current being passed from drain 205 to source 203 of the NMOS. The extra holes available in N-Well 210 for recombining with electrons removes the previously established ceiling on the N-Well current. Thus, second region 202 produces a conductivity modulation that increases the amount of current transport through N-Well 210.

In addition to the increased current transport produced by the conductivity modulation provided by the presence of P+-type conductivity second region 202, additional current is conducted from pad 250 through a PNP vertical bipolar junction transistor (BJT) created by this forward biasing of the P+/N-Well junction. Some of the holes injected by second region 202 will go to the reverse biased N-Well to P-type substrate junction and get collected by substrate 201. Thus, additional current 265 flows vertically (in this illustration) to the collector that, in this case, is P-type substrate 201 providing a secondary path from pad 250 to substrate 201.

The effect of the conductivity modulation and BJT current dissipation is illustrated in FIG. 5. FIG. 5 shows that after the P+/N-Well junction is forward biased, the amount of current conducted from pad 250 greatly increases with very little increase in pad voltage. Once the P+ to N-Well junction is forward biased, N-Well 210 does not limit the amount of current that can flow through the snapback of the grounded gate NMOS. Thus, provided the devices are of a sufficient width, the full ESD current can be dissipated through the combined flow of current from the NMOS snapback and the vertical PNP. One objective is to provide an ESD device that will dissipate 2–4 amps of ESD current at a pad without damaging circuit devices (e.g., gate oxides of transistor devices coupled to the pad). The invention contemplates that for an ESD device such as illustrated having a device width of 100–200 microns formed according to state-of-the-art processing techniques, including, in one instance, salicided transistor junctions, 2–4 amps at a pad may be supported without damage to devices of a circuit.

The configuration of the above embodiment of the device of the invention is similar in some respects to that of a silicon-controlled rectifier (SCR). However, the device of the invention does not function like a common SCR device. In general, an SCR device requires a latch-up condition to operate. In the example provided, a latch-up event would be required between two BJT actions: (1) P+-type conductivity second region 202, N-Well 210 and P-type substrate 201 and (2) N+-type conductivity source 203, P-type substrate 201 and N-Well 210. The NPN BJT generally requires source 203 of the ESD transistor to be in close proximity to, in the example described, P+-type conductivity second region 202.

The performance of the device of the invention is not limited by the proximity requirement of the doped regions to the source of the ESD transistor. Although it does not foreclose such a condition, the device of the invention does not rely on the latch-up event to increase the current dissipation at a pad. Instead, the device of the invention relies on conductivity modulation and a BJT effect to achieve the objective. Thus, the device of the invention will achieve the objective of increasing current dissipation beyond that of a prior art detached drain configuration in the absence of a latch-up event.

Figure 6:
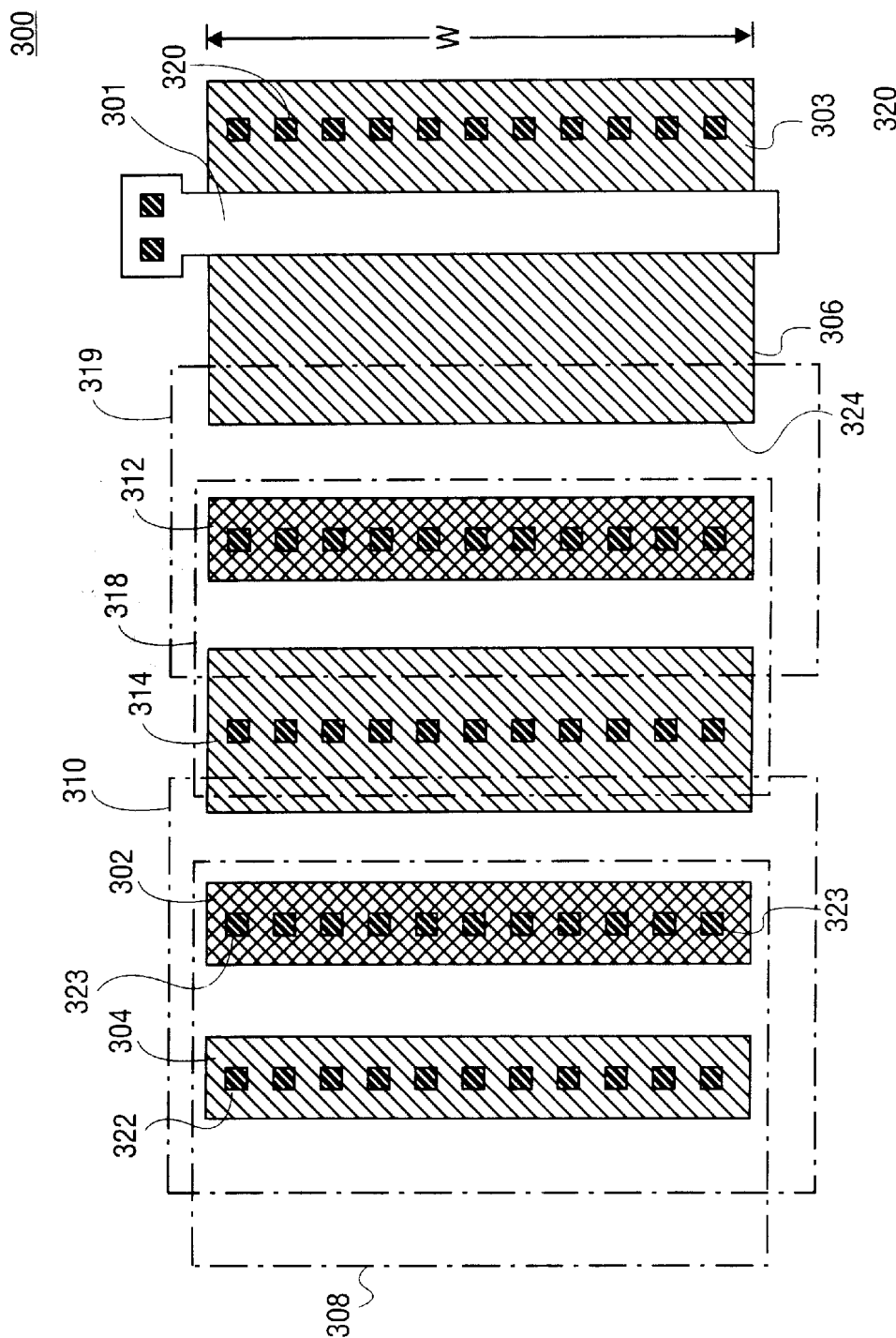
FIG. 6 shows a top plan view of a second embodiment of an electrostatic discharge device of the invention.
Figure 7:
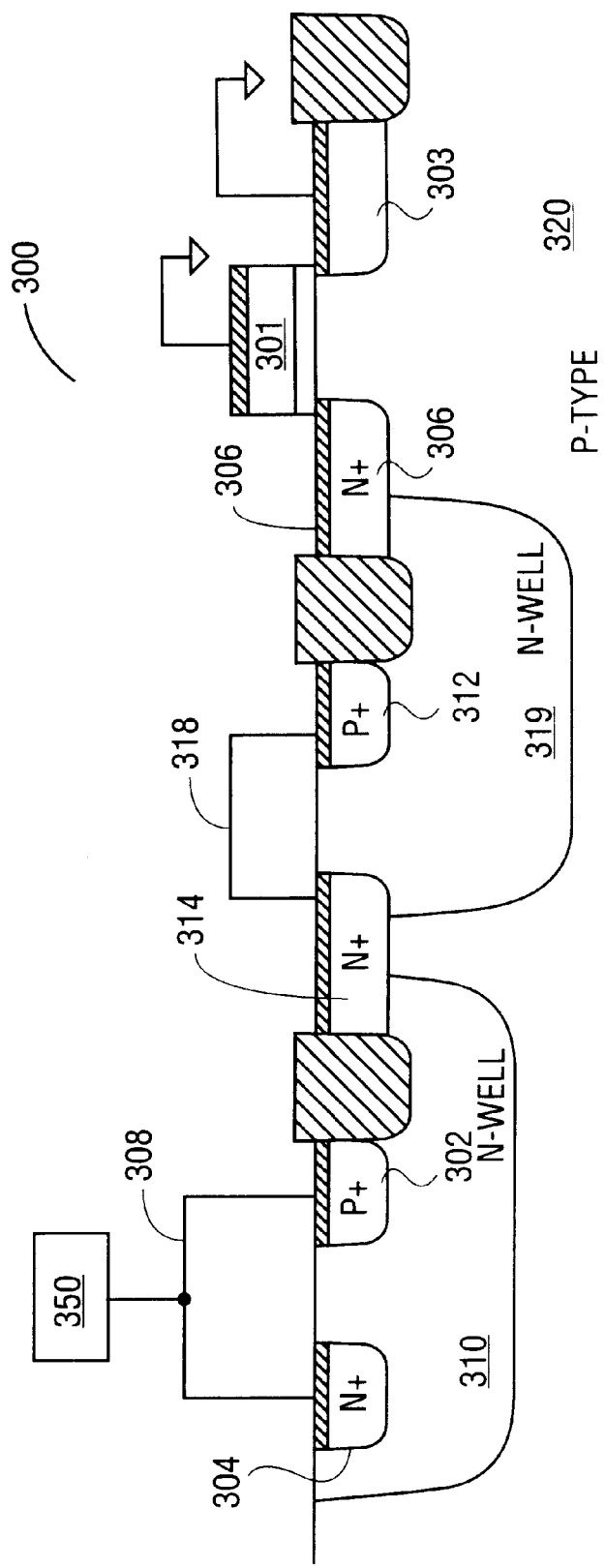
FIG. 7 shows a cross-sectional and schematic side view of the device of FIG. 6.

FIG. 6 and FIG. 7 show a second embodiment of a device of the invention. In this embodiment, additional regions are formed in an alternating or cascading fashion adjacent to the drain of a transistor of an ESD device. The figures show NMOS transistor gate electrode 301 overlying P-type substrate 320 with source 303 and drain 306 formed in P-type substrate 320 adjacent gate electrode 301. In this embodiment, gate electrode 301 is again made of polysilicon. Source 303 and drain 306 are N+-type conductivity regions.

ESD device 300 also includes first region 304 that includes N+ carriers (N+-type conductivity). First region 304 is detached from drain 306 itself. ESD device 300 also includes N-Well 310 introduced between drain 306 and first region 304. P+-type conductivity second region 302 is provided between the N+type region of drain edge 324 and first region 304. Second region 302 and first region 304 comprise a first stage and are coupled through contacts 322 and 323, respectively, to metal 308 to pad 350, such as a conventional integrated circuit pad for electrically coupling a chip to a package. First region 302 and second region 304 are formed in N-Well 310.

The embodiment illustrated in FIGS. 6 and 7 also includes additional regions 314 and 312. Region 314 is, in this example, an N+-type conductivity region similar to first region 304 while region 312 is a P+-type conductivity region similar to second region 302. N-Well 319 is formed in substrate 320, encompassing a portion of drain 306, region 312, and a portion of region 314. Region 314 is also encompassed by a portion of N-Well 310. Region 314 is coupled to region 312 through metal 318.

As illustrated in FIGS. 6 and 7, the doped regions alternate or are cascaded in that, proceeding away from drain edge 324, there is formed a P+-type conductivity region followed by N+-type conductivity region 314, followed by P+-type conductivity region 302, followed by N+-type conductivity region 304. As current is conducted from pad 350 to the first N+/P+ stage and then to the second N+/P+ stage, current is diverted into the substrate such as described above with respect to the first embodiment (e.g., BJT current dissipation). As current is conducted from second N+/P+ stage into drain 306, additional current is diverted into the substrate. A representative example of dissipating 1 amp of current at pad 250 is dissipating 0.5 amps to substrate 320 through a first PNP BJT formed in the first N+/P+ stage and dissipating 0.25 amps to substrate 320 through a second PNP BJT formed in the second N+/P+ stage (assuming a vertical PNP amplification factor (emitter current to base current ratio) of two). In this manner, the final current that needs to be supported by the grounded gate transistor is 0.25 amps. It is to be appreciated that the actual attenuation of current from pad 350 into drain 306 will depend on process parameters and the total number of stages.

By incorporating additional stages in a cascading or alternating fashion, the final current that needs to be supported by the grounded gate transistor is reduced substantially from the initial ESD current presented to the device. As a result, such a device can provide protection levels well beyond the ability of a grounded gate or a grounded gate with a detached drain contact configuration. It is to be appreciated that additional stages may be added (in a cascading or alternating fashion) to further reduce the dissipation requirements of the transistor. Design considerations (e.g., space considerations) will primarily dictate the feasibility of multiple stages.

In the preceding detailed description the invention is described with reference to specific embodiments thereof. It will, however, be evident that various modifications and changes may be made thereto without departing from the broader spirit and scope of the invention as set forth in the claims. For example, the embodiments were described in terms of salicided NMOS devices. It is to be appreciated that similar principles and teachings can be applied to other devices, including non-salicided devices. It is also to be appreciated that, in certain instances, the device of the invention does not utilize a grounded gate and/or a grounded source, but may be used in an active circuit that also provides ESD protection. One example is a pull-down device of an output buffer. Finally, the graphical representation illustrated in FIG. 5 sets forth a sequence of events and relatively specific shape for the curve. It is to be appreciated that differences between devices, while within the scope of the invention, may alter the sequence of events and shape of the curve. The specification and drawings are, accordingly, to be regarded in an illustrative rather than a restrictive sense.

What is claimed is:

1. In a device having a grounded gate electrode and a grounded source of a transistor, the device comprising:

a drain of the transistor of a first conductivity type and first concentration located in a first well of the first conductivity type and second concentration in the substrate;

a first region of the first conductivity type formed in the first well and coupled to a pad;

a second region of a second conductivity type different from the first conductivity type formed in the first well between the first region and the drain, and alternating conductivity type regions located in a second well between the drain and the second region, such that a region of the second conductivity type is proximally adjacent the drain and a region of the first conductivity type is located in a portion of the first well and a portion of the second well, wherein the device protects a portion of the integrated circuit against electrostatic discharge introduced at the pad by biasing a junction between the second region and the well toward current flow in the absence of a latch-up event.

2. A device comprising:

a transistor having a drain of a first conductivity type located in a first well of the first conductivity type and a different concentration in the substrate;

a first stage formed in the first well comprising a region of a first conductivity type and concentration similar to the drain and a region of a second conductivity type such that a region of the second conductivity type separates the drain and a region of the first conductivity type; and a second stage formed in a second well of the first conductivity type, the second stage comprising a region of a first conductivity type and concentration similar to the drain and a region of a second conductivity type and one of the second regions is coupled to a pad of an integrated circuit.

3. The device of claim 2, wherein the region of a first conductivity type of the first stage is formed in a portion of the second well.

4. The device of claim 3, wherein each of the regions of the second stage are coupled to the pad.

5. The device of claim 3, wherein the regions of the first stage and the second stage have widths similar to the drain.

6. The device of claim 3, wherein the transistor further comprises a gate electrode and a source and the gate electrode and the source are grounded.

* * * * *